(12) United States Patent
Chen et al.

(10) Patent No.: US 11,164,857 B2
(45) Date of Patent: Nov. 2, 2021

(54) SEMICONDUCTOR DEVICE PACKAGES, PACKAGING METHODS, AND PACKAGED SEMICONDUCTOR DEVICES

(71) Applicant: Taiwan Semiconductor Manufacturing Company, Ltd., Hsinchu (TW)

(72) Inventors: Jie Chen, New Taipei (TW); Ying-Ju Chen, Tuku Township (TW); Hsien-Wei Chen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/997,413

(22) Filed: Jun. 4, 2018

(65) Prior Publication Data

US 2018/0286847 A1    Oct. 4, 2018

Related U.S. Application Data

(60) Continuation of application No. 15/353,334, filed on Nov. 16, 2016, now Pat. No. 9,991,247, which is a
(Continued)

(51) Int. Cl.
*H01L 23/495* (2006.01)
*H01L 25/00* (2006.01)
(Continued)

(52) U.S. Cl.
CPC ............. *H01L 25/50* (2013.01); *H01L 21/56* (2013.01); *H01L 21/561* (2013.01); *H01L 21/565* (2013.01); *H01L 21/568* (2013.01); *H01L 21/6835* (2013.01); *H01L 21/76838* (2013.01); *H01L 21/78* (2013.01); *H01L 23/12* (2013.01); *H01L 23/3128* (2013.01); *H01L 23/49816* (2013.01); *H01L 23/49827* (2013.01); *H01L 23/5389* (2013.01); *H01L 23/544* (2013.01); *H01L 23/562* (2013.01); *H01L 23/585* (2013.01); *H01L 24/06* (2013.01);
(Continued)

(58) Field of Classification Search
CPC . H01L 23/12; H01L 23/528; H01L 23/49811; H01L 23/49827; H01L 23/544; H01L 23/562; H01L 23/585
USPC .................................................. 257/773, 786
See application file for complete search history.

(56) References Cited

U.S. PATENT DOCUMENTS

| 5,241,456 A | 8/1993 | Marcinkiewicz et al. |
| 5,315,486 A * | 5/1994 | Fillion ................. H01L 23/057 174/253 |

(Continued)

FOREIGN PATENT DOCUMENTS

CN         101981691 A    2/2011

*Primary Examiner* — Nitin Parekh
(74) *Attorney, Agent, or Firm* — Slater Matsil, LLP

(57) ABSTRACT

Semiconductor device packages, packaging methods, and packaged semiconductor devices are disclosed. In some embodiments, a package for a semiconductor device includes an integrated circuit die mounting region and a molding material disposed around the integrated circuit die mounting region. An interconnect structure is disposed over the molding material and the integrated circuit die mounting region. A protection pattern is disposed in a perimeter region of the package. The protection pattern includes a conductive feature.

20 Claims, 10 Drawing Sheets

Related U.S. Application Data division of application No. 14/326,249, filed on Jul. 8, 2014, now Pat. No. 9,502,270.

(51) Int. Cl.

| | |
|---|---|
| *H01L 21/78* | (2006.01) |
| *H01L 21/683* | (2006.01) |
| *H01L 23/31* | (2006.01) |
| *H01L 23/58* | (2006.01) |
| *H01L 23/498* | (2006.01) |
| *H01L 23/538* | (2006.01) |
| *H01L 23/544* | (2006.01) |
| *H01L 23/00* | (2006.01) |
| *H01L 25/065* | (2006.01) |
| *H01L 21/56* | (2006.01) |
| *H01L 21/768* | (2006.01) |
| *H01L 23/12* | (2006.01) |
| *H01L 25/10* | (2006.01) |

(52) U.S. Cl.
CPC .............. *H01L 24/19* (2013.01); *H01L 24/20* (2013.01); *H01L 24/73* (2013.01); *H01L 24/97* (2013.01); *H01L 25/0657* (2013.01); H01L 24/32 (2013.01); H01L 24/48 (2013.01); H01L 25/105 (2013.01); H01L 2221/68372 (2013.01); H01L 2223/5442 (2013.01); H01L 2223/54426 (2013.01); H01L 2223/54486 (2013.01); H01L 2224/04042 (2013.01); H01L 2224/04105 (2013.01); H01L 2224/12105 (2013.01); H01L 2224/2518 (2013.01); H01L 2224/32145 (2013.01); H01L 2224/32225 (2013.01); H01L 2224/45015 (2013.01); H01L 2224/48091 (2013.01); H01L 2224/48227 (2013.01); H01L 2224/73265 (2013.01); H01L 2224/85399 (2013.01); H01L 2224/97 (2013.01); H01L 2225/0651 (2013.01); H01L 2225/06568 (2013.01); H01L 2225/1035 (2013.01); H01L 2225/1041 (2013.01); H01L 2225/1058 (2013.01); H01L 2924/00014 (2013.01); H01L 2924/14 (2013.01); H01L 2924/1431 (2013.01); H01L 2924/1433 (2013.01); H01L 2924/1434 (2013.01); H01L 2924/1436 (2013.01); H01L 2924/15311 (2013.01); H01L 2924/181 (2013.01); H01L 2924/18162 (2013.01); H01L 2924/18165 (2013.01)

(56) References Cited

U.S. PATENT DOCUMENTS

| | | | |
|---|---|---|---|
| 5,355,102 A | 10/1994 | Komrumpf et al. | |
| 5,497,033 A | 3/1996 | Fillion et al. | |
| 5,565,706 A * | 10/1996 | Miura | H01L 23/13 257/723 |
| 5,677,576 A | 10/1997 | Akagawa | |
| 5,691,248 A | 11/1997 | Cronin et al. | |
| 5,841,193 A * | 11/1998 | Eichelberger | H01L 23/5389 257/723 |
| 5,990,546 A | 11/1999 | Igarashi et al. | |
| 6,130,823 A | 10/2000 | Lauder et al. | |
| 6,271,469 B1 * | 8/2001 | Ma | H01L 21/56 174/521 |
| 6,274,391 B1 | 8/2001 | Wachtler et al. | |
| 6,495,914 B1 * | 12/2002 | Sekine | H01L 25/50 257/723 |
| 6,590,291 B2 | 7/2003 | Akagawa | |
| 6,709,897 B2 * | 3/2004 | Cheng | H01L 23/13 257/E23.004 |
| 7,279,750 B2 | 10/2007 | Jobetto | |
| 7,635,641 B2 | 12/2009 | Hurwitz et al. | |
| 7,669,320 B2 | 3/2010 | Hurwitz et al. | |
| 7,682,972 B2 | 3/2010 | Hurwitz et al. | |
| 7,741,194 B2 | 6/2010 | Griffiths | |
| 7,898,093 B1 * | 3/2011 | Darveaux | H01L 23/562 257/787 |
| 8,093,704 B2 | 1/2012 | Palmer et al. | |
| 8,749,049 B2 * | 6/2014 | Mo | H01L 23/49822 257/698 |
| 9,034,696 B2 * | 5/2015 | Mohammed | H01L 23/3128 438/117 |
| 2001/0030059 A1 | 10/2001 | Sugaya et al. | |
| 2003/0122243 A1 | 7/2003 | Lee et al. | |
| 2007/0080458 A1 | 4/2007 | Ogawa et al. | |
| 2008/0150164 A1 * | 6/2008 | Chia | H01L 23/49833 257/783 |
| 2008/0237836 A1 | 10/2008 | Chia et al. | |
| 2008/0308946 A1 | 12/2008 | Pratt | |
| 2009/0236031 A1 | 9/2009 | Sunohara et al. | |
| 2009/0261466 A1 | 10/2009 | Pagaila et al. | |
| 2010/0200975 A1 | 8/2010 | Chino | |
| 2011/0204505 A1 | 8/2011 | Pagaila et al. | |
| 2012/0074534 A1 | 3/2012 | Lin et al. | |
| 2012/0074586 A1 | 3/2012 | Seo et al. | |
| 2012/0146236 A1 | 6/2012 | Lin et al. | |
| 2012/0319295 A1 | 12/2012 | Chi et al. | |
| 2013/0037935 A1 * | 2/2013 | Xue | H01L 21/76898 257/737 |
| 2013/0037936 A1 | 2/2013 | Choi et al. | |
| 2013/0087914 A1 | 4/2013 | Yang et al. | |
| 2013/0217186 A1 | 8/2013 | Tani et al. | |
| 2014/0091455 A1 * | 4/2014 | Strothmann | H01L 21/6836 257/734 |
| 2014/0124947 A1 | 5/2014 | Chuang et al. | |
| 2014/0264951 A1 * | 9/2014 | Faruqui | H01L 25/0657 257/783 |
| 2014/0361411 A1 | 12/2014 | Yamamichi et al. | |
| 2015/0021764 A1 | 1/2015 | Paek et al. | |
| 2015/0102829 A1 | 4/2015 | Son et al. | |
| 2015/0123283 A1 | 5/2015 | Bae et al. | |
| 2015/0187742 A1 | 7/2015 | Kwon et al. | |
| 2015/0294896 A1 | 10/2015 | Hurwitz et al. | |
| 2016/0005628 A1 | 1/2016 | Yap et al. | |
| 2016/0013138 A1 | 1/2016 | Chen et al. | |
| 2016/0118327 A1 | 4/2016 | Hsu et al. | |
| 2016/0233166 A1 * | 8/2016 | Teh | H01L 24/19 |

* cited by examiner

SEMICONDUCTOR DEVICE PACKAGES, PACKAGING METHODS, AND PACKAGED SEMICONDUCTOR DEVICES

CROSS-REFERENCE TO RELATED APPLICATIONS

This application is a continuation of U.S. patent application Ser. No. 15/353,334, filed on Nov. 16, 2016, entitled "Semiconductor Packages, Packaging Methods, and Packaged Semiconductor Devices," which application it a divisional of U.S. patent application Ser. No. 14/326,249, filed on Jul. 8, 2014, entitled "Semiconductor Device Packages, Packaging Methods, and Packaged Semiconductor Devices," now U.S. Pat. No. 9,502,270 issued on Nov. 22, 2016, which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
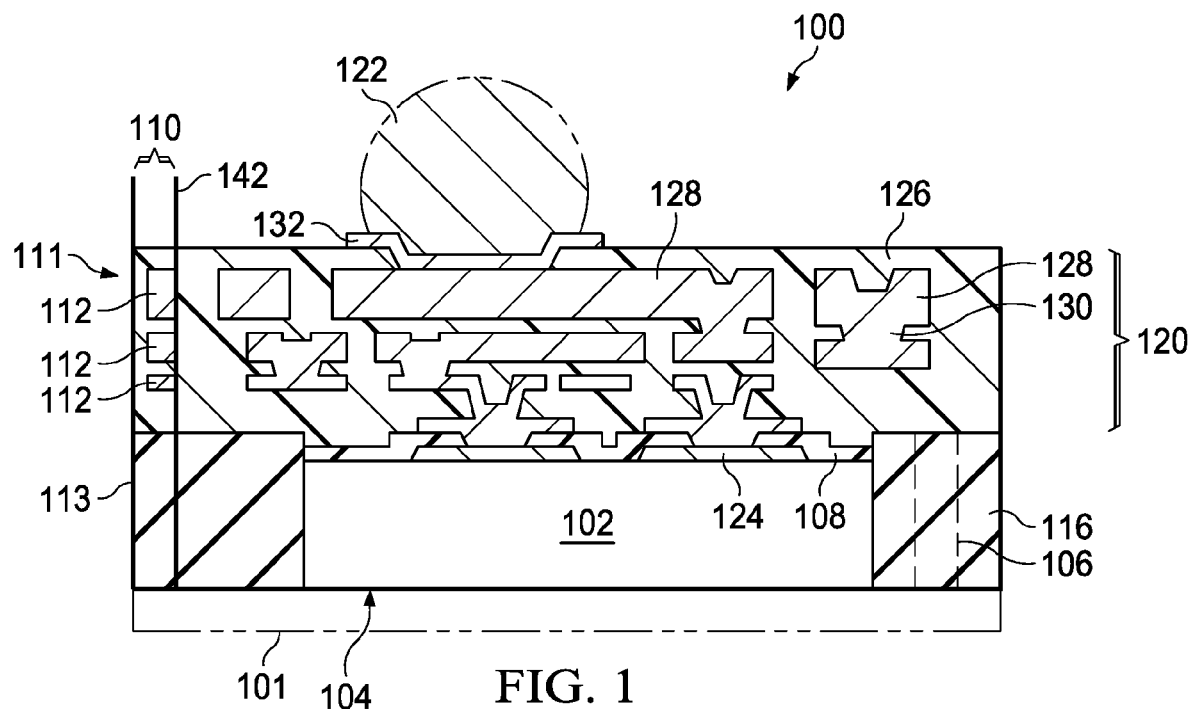
FIG. 1 is a cross-sectional view of a portion of a packaged semiconductor device in accordance with some embodiments of the present disclosure, wherein a protection pattern is formed in a perimeter region of the package.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide novel packages for semiconductor devices, methods of packaging semiconductor devices, and packaged semiconductor devices wherein protection patterns are formed in a perimeter region of the package. The protection patterns protect the package area during dicing and may also be used as alignment patterns.

Referring first to FIG. 1, a cross-sectional view of a portion of a packaged semiconductor device 100 in accordance with some embodiments of the present disclosure is shown. The packaged semiconductor device 100 includes a protection pattern in that is formed in a perimeter region no of the package. The perimeter region no comprises a protection pattern area that includes the protection pattern 111. The protection pattern 111 comprises one or more conductive features 112, and comprises a metal pattern in some embodiments, to be described further herein.

The packaged semiconductor device 100 includes an integrated circuit die 102 that is packaged in a package that includes a molding material 116 and an interconnect structure 120 disposed over the integrated circuit die 102 and the molding material 116. The molding material 116 surrounds and encapsulates the integrated circuit die 102. The molding material 116 comprises an insulating material such as a molding compound or an underfill material, as examples. Through-vias 106 are formed in the molding material 116 in some embodiments, as shown in phantom (e.g., in dashed lines) in FIG. 1. Only one through-via 106 is shown in phantom in FIG. 1; however, the packaged semiconductor device 100 may include dozens, hundreds, or more through-vias 106 formed therein. In other embodiments, through-vias 106 are not included within the molding material 116. The interconnect structure 120 is electrically connected to the integrated circuit die 102. The package includes an integrated circuit die mounting region 104 wherein the integrated circuit die 102 is disposed.

The protection pattern 111 is disposed in the perimeter region 110 of the package which is disposed between a package edge 142 and a dicing path 113 of the package. The package edge 142 comprises a region proximate the perimeter region 110 past which no conductive features are formed in the interconnect structure 120, in some embodiments. The package edge 142 comprises an enclosure region or edge region of the interconnect structure 120 in some embodiments, for example.

The dicing path 113 comprises a region wherein a plurality of the packaged semiconductor devices 100 will be singulated using a dicing process (e.g., using a saw, laser, or other device) after the packaging process. The dicing path 113 may comprise a scribe line region or a scribe region of a wafer level packaging (WLP) technique in some embodiments, for example. The packaged semiconductor device 100 comprises a WLP in some embodiments, which is formed over a carrier 101, shown in phantom. The carrier 101 is later removed, after the packaging process for the integrated circuit die 102, to be described further herein with reference to FIG. 16. In other embodiments, a carrier 101 may not be included in the packaging process flow.

In some embodiments, the protection pattern 111 is disposed within a material layer that a portion of the interconnect structure 120 is formed in. For example, in FIG. 1, the protection pattern 111 comprises a plurality of conductive features 112 that is disposed in the conductive feature layers, such as conductive line 128 layers and conductive via 130 layers, of the interconnect structure 120. Thus, no additional processing steps or material layers are required to include the conductive features 112 of the protection pattern 111 in the package. Existing lithography masks and packaging processes for the conductive features of the interconnect structure 120 can advantageously be modified to include the protection pattern 111 in the packaged semiconductor device 100. In some embodiments, the interconnect structure 120 comprises a plurality of conductive feature layers, and the plurality of conductive features 112 of the protection pattern 111 is disposed in one or more of the plurality of conductive feature layers of the interconnect structure 120.

Because the conductive features 112 of the protection pattern 111 are formed in the same material layer that conductive features in one or more conductive feature layers of the interconnect structure 120 are formed in, the conductive features 112 of the protection pattern 111 comprise the same material as the conductive features in the conductive feature layer of the interconnect structure 120 in some embodiments. The conductive features 112 comprise a metal in some embodiments, for example. The metal comprises Cu, Al, W, or alloys, combinations, or multiple layers thereof, as examples. The conductive features 112 may alternatively comprise other materials.

In some embodiments, the conductive features 112 of the protection pattern 111 comprise substantially the same size as conductive features in one or more conductive feature layers of the interconnect structure 120. For example, because the conductive features 112 of the protection pattern 111 are formed in the same material layer that conductive features are formed in conductive layers of the interconnect structure 120 are formed in, the conductive features 112 of the protection pattern 111 comprise the same thickness as conductive features in conductive layers of the interconnect structure 120. The conductive features 112 of the protection pattern 111 can be designed to have substantially the same width as conductive features in conductive layers of the interconnect structure 120.

For example, in some embodiments, a plurality of the conductive features 112 comprises a plurality of first conductive features 112, and a plurality of the conductive feature layers in the interconnect structure 120 comprises a plurality of second conductive features 128 and/or 130 disposed therein. The plurality of first conductive features 112 comprises a first size, and the plurality of second conductive features 128 and/or 130 comprises a second size, the first size being substantially the same as the second size.

Alternatively, the conductive features 112 of the protection pattern 111 can be designed to have a different width than conductive features in conductive layers of the interconnect structure 120.

The interconnect structure 120 comprises a redistribution layer (RDL) or a post-passivation interconnect (PPI) structure in some embodiments. The interconnect structure 120 may alternatively comprise other types of wiring structures. The interconnect structure 120 comprises fan-out regions of wiring for the packaged semiconductor device 100 in some embodiments. The fan-out regions of the interconnect structure 120 provide a larger footprint for the package (e.g., for the under-ball metallization (UBM) structure 132) than the footprint of contacts 124 on the integrated circuit die 102, for example.

In some embodiments, the integrated circuit die 102 includes a plurality of contact pads 124 formed on a surface thereof, and a passivation material 108 is disposed over the integrated circuit die 102 and portions of the contact pads 124. Portions of the interconnect structure 120 are coupled to the contact pads 124 of the integrated circuit die 102 through openings in the passivation material 108. The passivation material 108 may not be included. Portions of the interconnect structure 120 may also be coupled to the through-vias 106, not shown, in embodiments wherein the through-vias 106 are included.

The interconnect structure 120 includes a plurality of insulating material layers 126 in some embodiments. The insulating material layers 126 comprise a polymer or other insulating materials. A plurality of conductive lines 128 and a plurality of conductive vias 130 are disposed within the insulating material layers 126. The interconnect structure 120 may include one or more conductive line 128 layers and one or more via 130 layers, in some embodiments.

The UBM structure 132 is formed over and/or within insulating material layer 126. The UBM structure 132 is coupled to the conductive lines 128 and/or vias 130. Only one UBM structure 132 is shown in FIG. 1; however, a plurality of the UBM structures 132 is formed on the surface of the interconnect structure 120. The conductive features of the interconnect structure 120 comprising the conductive lines 128, vias 130, and the UBM structure 132 may comprise a conductive material such as Cu, Al, W, other metals, or alloys, combinations, or multiple layers thereof, as examples. The conductive features of the interconnect structure 120 comprising the conductive lines 128 and vias 130, and the UBM structure 132 are each formed in a conductive feature layer of the packaged semiconductor device 100. Alternatively, the interconnect structure 120 may comprise other types of conductive features and may be comprised of other materials.

Connectors 122 (shown in phantom in FIG. 1) are coupled to the UBM structure 132 in some embodiments. A plurality of the connectors 122 are coupled to a plurality of the UBM structures 132 of the interconnect structure 120 in some embodiments, for example. In other embodiments, the connectors 122 are not included in the packaged semiconductor device 100. The connectors 122 comprise a eutectic material and may comprise connectors formed in a ball grid array (BGA) arrangement or other configurations, for example.

Figure 2:
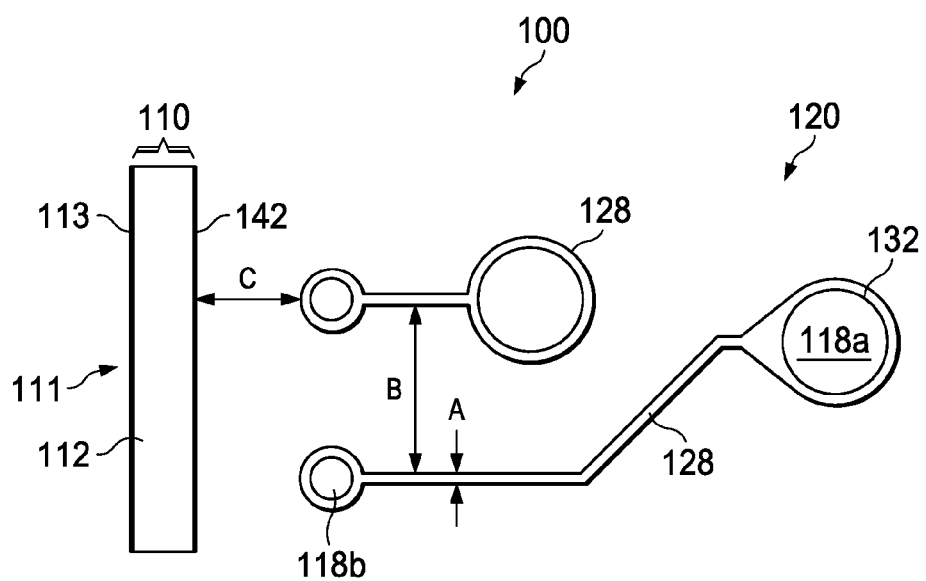
FIG. 2 is a top view illustrating a protection pattern of a packaged semiconductor device in accordance with some embodiments.
Figure 15:
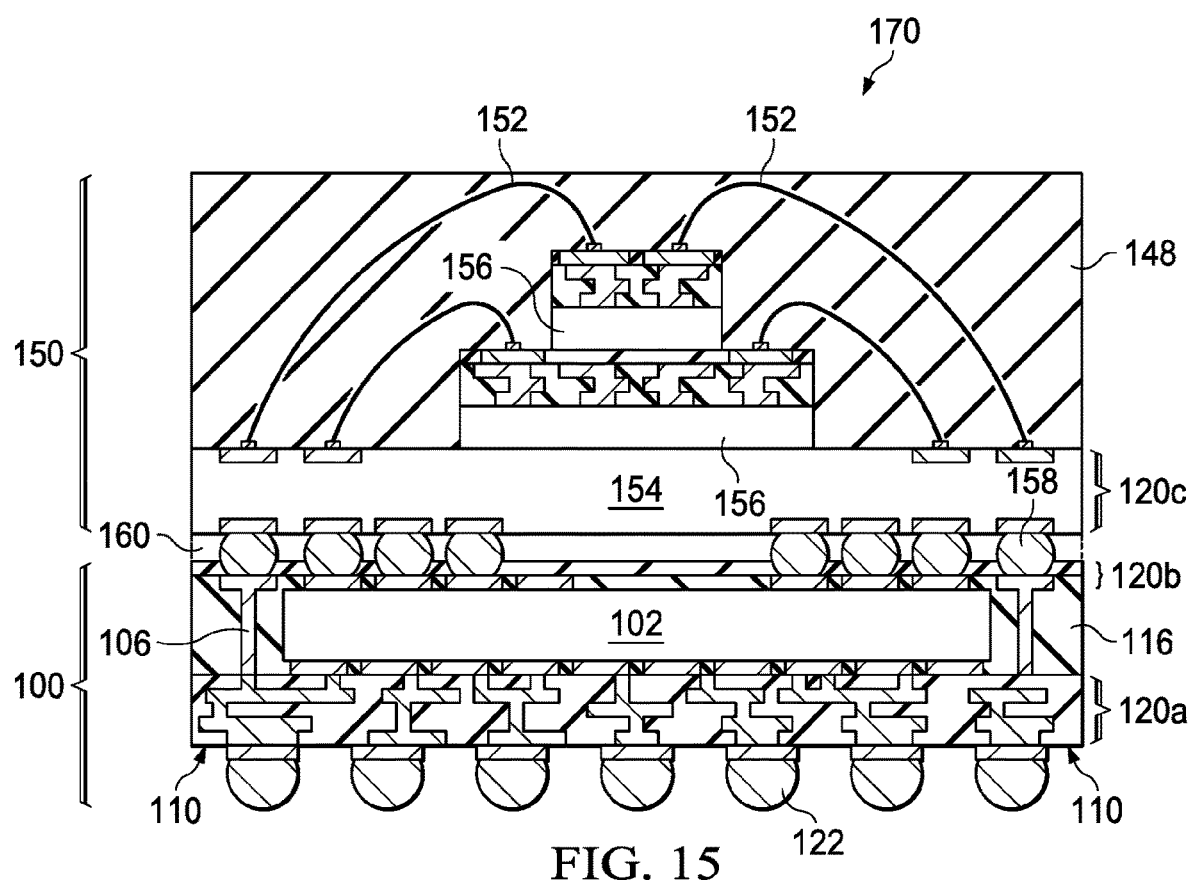
FIG. 15 is a cross-sectional view of a packaged semiconductor device in accordance with some embodiments, wherein a first packaged semiconductor device is coupled to a second packaged semiconductor device.

FIG. 2 is a top view of the portion of the packaged semiconductor device 100 shown in FIG. 1 in accordance with some embodiments. The protection pattern 111 extends along the package edge 142 of a side of the packaged semiconductor device 100, within the perimeter region 110. In some embodiments, the package of the packaged semiconductor device 100 comprises a plurality of sides, and the plurality of conductive features 112 of the protection pattern 111 extends along the package edge 142 of the plurality of sides of the package. For example, two sides of the packaged semiconductor device 100 are shown in FIG. 15. In a top view (not shown), the packaged semiconductor device 100 comprises a shape of a square or rectangle in some embodiments, and the conductive features 112 of the protection pattern extend along the package edge 142 of the four sides of the package within the perimeter region 110, as another example.

Referring again to FIG. 2, a top view of conductive features of the interconnect structure 120 is also shown. Portions of conductive lines 128 and UBM structures 132 and openings 118a and 118b in insulating material 126 are illustrated. Other portions of the insulating material 126 are not shown, so that some portions of conductive lines 128 and UBM structures 132 can be shown, for example. Dimension A comprises a width of conductive lines 128, wherein dimension A comprises about 50 µm to about 10 µm in some embodiments. Dimension B comprises a space between adjacent conductive lines 128, wherein dimension B comprises about 30 µm to about 50 µm in some embodiments. Dimension C comprises the distance between a conductive feature such as conductive line 128 and the package edge 142, wherein dimension C comprises about 20 µm or greater in some embodiments. Alternatively, dimensions A, B, and C may comprise other values.

Figure 3:
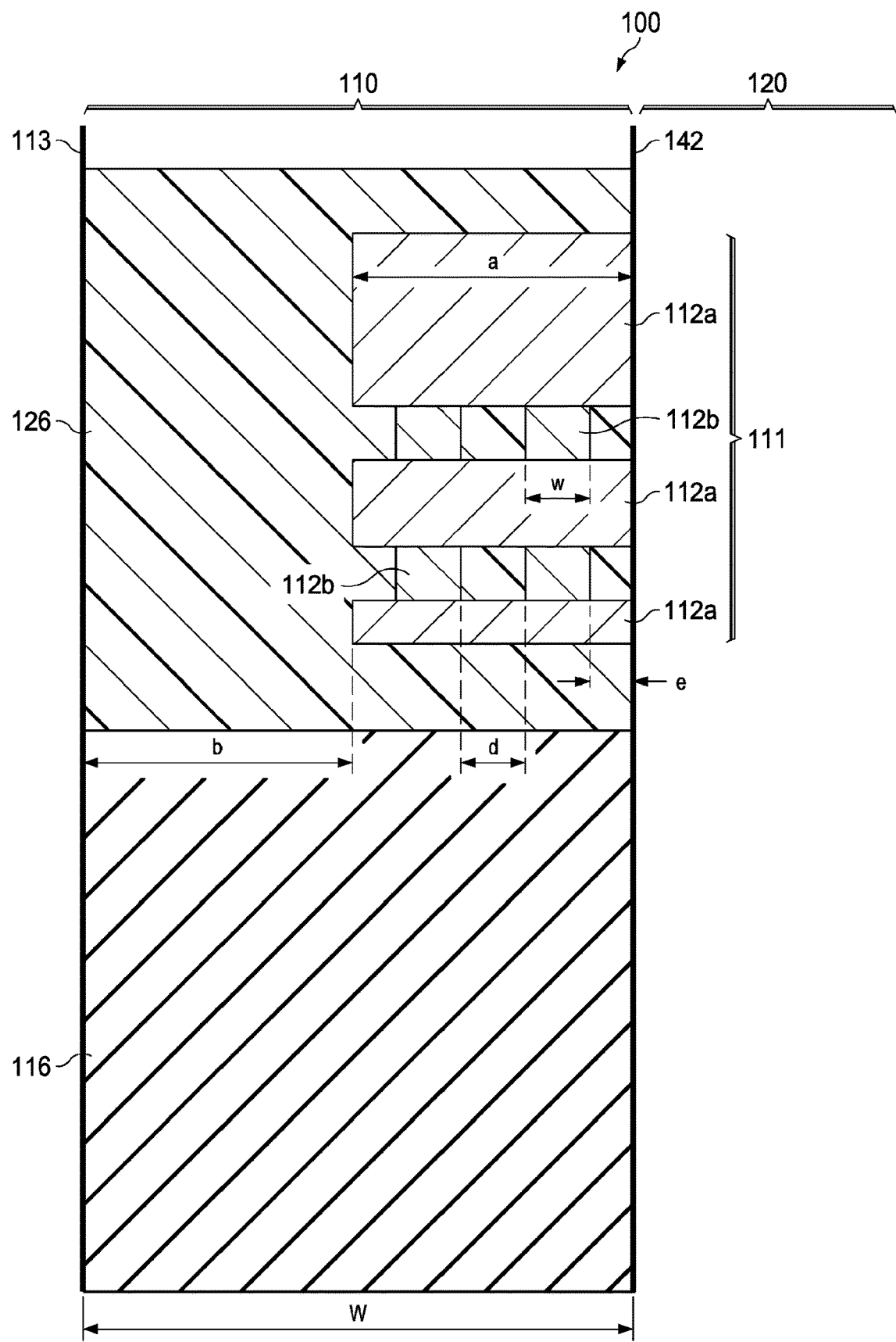
FIG. 3 is a cross-sectional view of a portion of a packaged semiconductor device in accordance with some embodiments of the present disclosure, wherein a protection pattern is formed in conductive feature layers of an interconnect structure in a perimeter region of the package.

FIG. 3 is a cross-sectional view of a portion of a packaged semiconductor device 100 in accordance with some embodiments of the present disclosure, wherein a protection pattern 111 is formed in conductive feature layers of an interconnect structure 120 (not shown in FIG. 3; see FIG. 1) in a perimeter region 110 of the package. The conductive features 112a and 112b are formed in every conductive feature layer of the interconnect structure 120 in the embodiments shown in FIG. 3, for example. In other embodiments, the conductive features 112a and/or 112b are formed in one or more conductive feature layers of the interconnect structure 120.

The conductive features 112a and/or 112b are formed in the same insulating material layers 126 that conductive lines 128 and vias 130 are formed in, in the interconnect structure 120. The molding material 116 is disposed beneath the protection pattern in formed in the insulating material layers 126.

Some dimensions of the protection pattern 111 are also shown in FIG. 3. Dimension a comprises a width of a conductive feature 112a of the protection pattern 111 formed in a conductive line 128 layer of an interconnect structure 120, wherein dimension a comprises about 50 µm or less in some embodiments. Dimension a is substantially the same as dimension A of conductive lines 128 in the interconnect structure 120 (see FIG. 2) in some embodiments. Alternatively, dimension a may be larger or smaller than dimension A.

Dimension b comprises a distance between a conductive feature 112a or 112b and the dicing path 113, wherein dimension b comprises about 5 µm to about 10 µm in some embodiments. Dimension b is large enough to prevent damage to the protection pattern 111 during a dicing process along the dicing path 113 in some embodiments, for example. Alternatively, in other embodiments, dimension b may be about o. Dimension b may also comprise other values.

Dimension W comprises a width of the perimeter region no that includes the protection region area of the protection pattern 111. Dimension W is equal to (dimension a+dimension b). In some embodiments, dimension W comprises about 5 µm to about 60 µm.

Dimension w comprises a width of a conductive feature 112b of the protection pattern 111 formed in a via 130 layer of an interconnect structure 120, wherein dimension w comprises about 5 µm to about 10 µm some embodiments. Dimension w is substantially the same as a width of vias 130 formed in a via 130 layer of the interconnect structure 120 in some embodiments. Alternatively, dimension w may be larger or smaller than the width of vias 130.

Dimension d comprises a distance between adjacent conductive features 112b of the protection pattern in formed in a via 130 layer of the interconnect structure 120, wherein dimension d comprises about 10 µm or greater in some embodiments. Dimension d is substantially the same as a spacing between vias 130 formed in a via 130 layer of the interconnect structure 120 in some embodiments. Alternatively, dimension d may be different than the spacing between vias 130.

Dimension e comprises a distance between conductive features 112b of the protection pattern 111 formed in a via 130 layer of the interconnect structure 120 and the package edge 142, wherein dimension e comprises about 5 μm or greater in some embodiments. Dimension e also comprises a distance between conductive features 112b and an edge of conductive features 112a formed in a conductive line 128 layer of the interconnect structure 120, for example.

Dimensions a, b, W, w, d, and e may alternatively comprise other values in accordance with some embodiments of the present disclosure.

Figure 4:
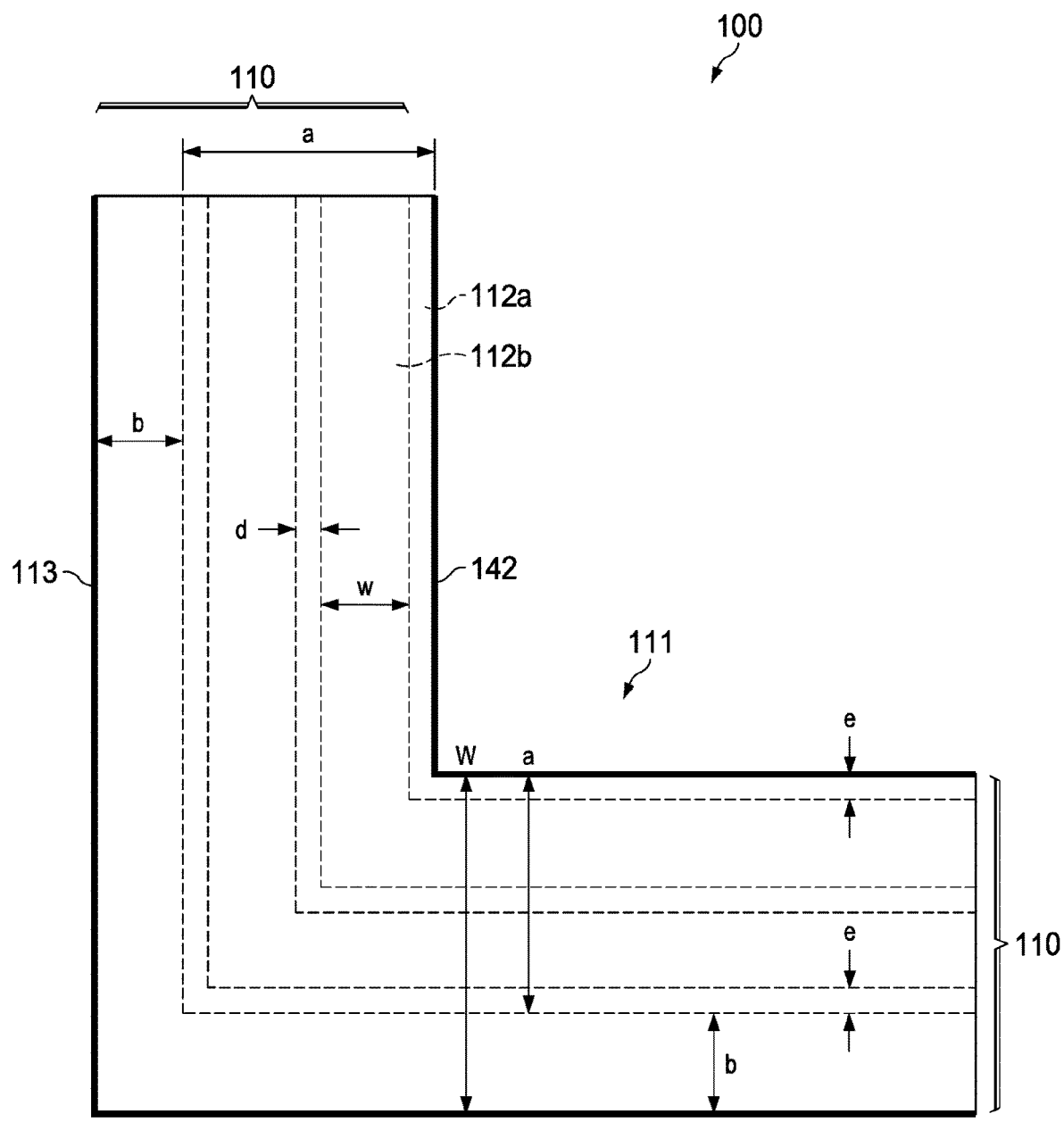
FIG. 4 is a top view of the portion of the packaged semiconductor device shown in FIG. 3 in accordance with some embodiments.
Figure 6:
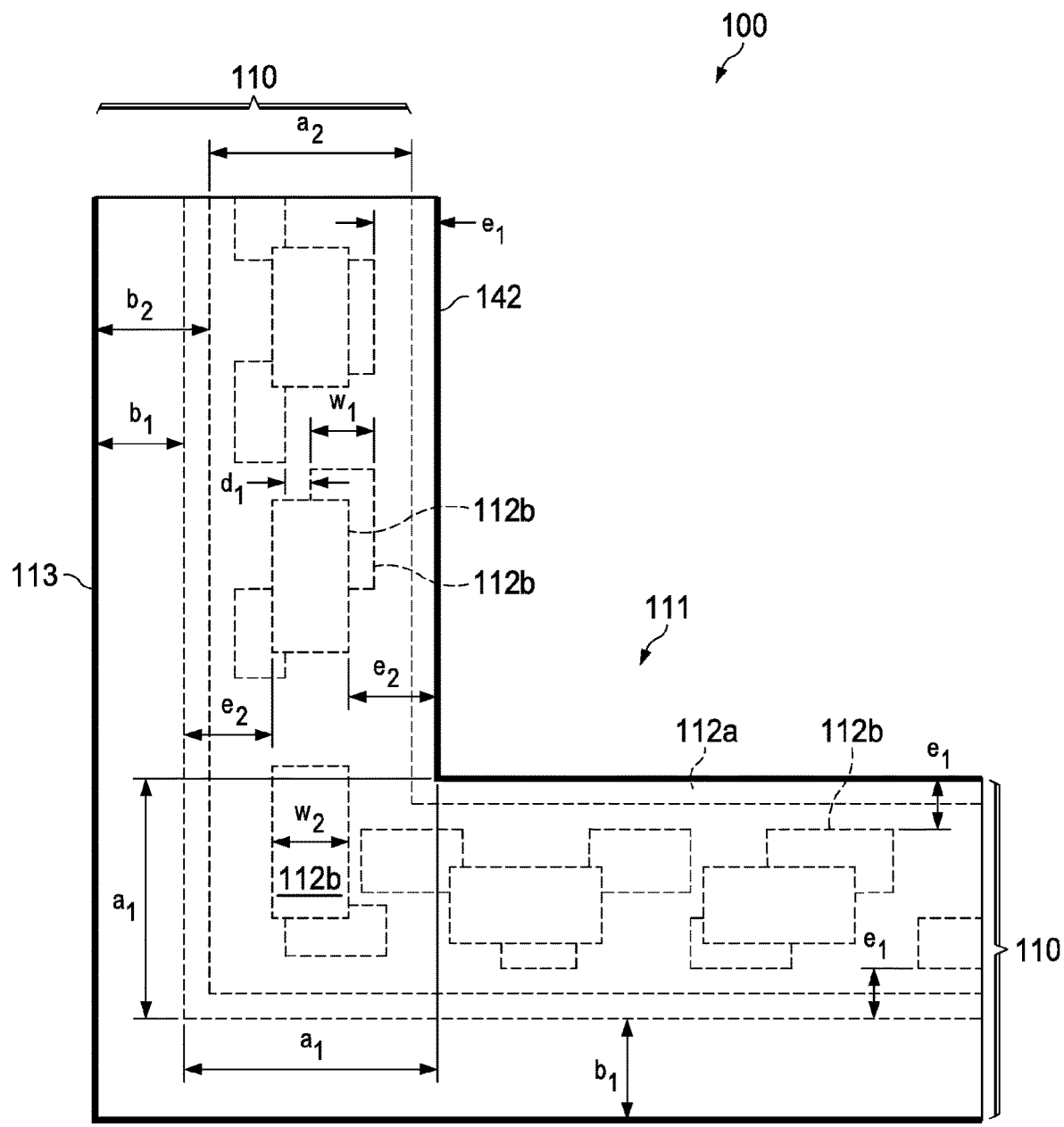
FIG. 6 is a top view of the portion of the packaged semiconductor device shown in FIG. 5 in accordance with some embodiments.

FIG. 4 is a top view of the portion of the packaged semiconductor device 100 shown in FIG. 3 in accordance with some embodiments. The protection pattern 111 extends fully along the package edge 142 to provide protection for the packaged semiconductor device 100 during a dicing process and other processes. The conductive features 112b of the protection pattern 111 formed in a via 130 layer of the interconnect structure 120 comprise continuous via bars in the embodiments shown. Alternatively, the conductive features 112b may comprise non-continuous via bars, as shown in FIG. 6, or the conductive features 112b may comprise a plurality of square, rectangular, circular, or other shaped features 112b (not shown).

Figure 5:
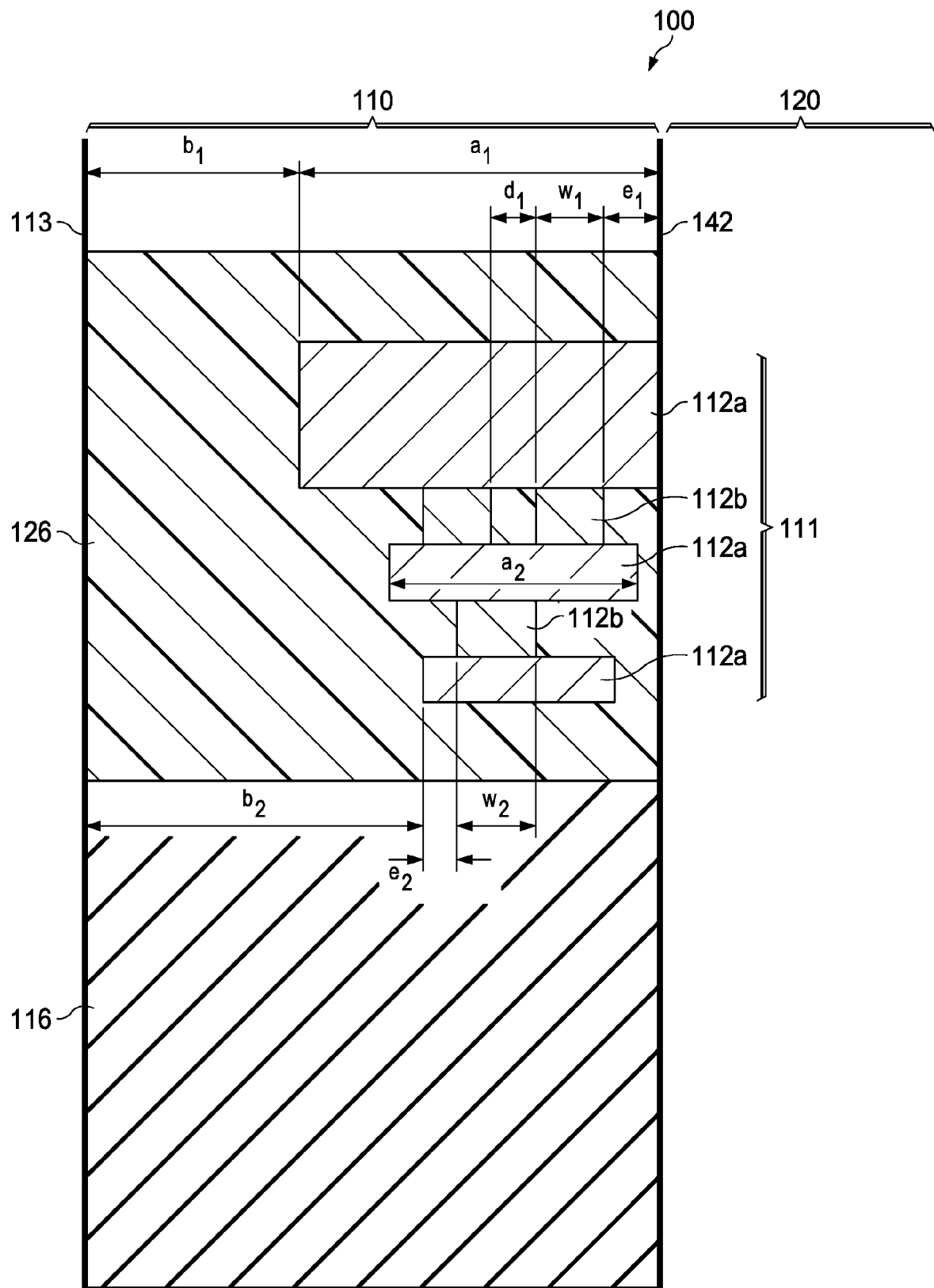
FIG. 5 is a cross-sectional view of a portion of a packaged semiconductor device in accordance with some embodiments of the present disclosure, wherein a protection pattern is formed in conductive feature layers of an interconnect structure in a perimeter region of the package.

In the embodiments shown in FIGS. 3 and 4, conductive features 112a formed in conductive line 128 layers of the interconnect structure 120 comprise substantially the same width. For example, a plurality of the conductive features 112a of the protection pattern 111 is disposed in a plurality of conductive line 128 layers of the interconnect structure 120, and two of the plurality of conductive features 112a disposed in two different ones of the plurality of conductive line 128 layers comprise substantially the same width. In other embodiments, two of the plurality of conductive features 112a disposed in two different ones of the plurality of conductive line 128 layers comprise different widths, as shown in FIG. 5, which is a cross-sectional view of a portion of a packaged semiconductor device wo in accordance with some embodiments of the present disclosure. The protection pattern 111 is formed in conductive feature 128 layers of an interconnect structure 120 in a perimeter region no of the package, as described in the embodiments shown in FIGS. 3 and 4. However, the conductive features 112a comprise different widths in the various conductive line 128 layers.

For example, dimension $a_1$ comprises a width of an uppermost conductive feature 112a, and dimension $a_2$ comprises a width of a lowermost conductive feature 112a in FIG. 5. Dimension $a_1$ and $a_2$ comprise similar dimensions as described for dimension a herein. Dimension $a_1$ is different, e.g., larger than, dimension $a_2$ in the example shown. Dimension $a_1$ being different than dimension $a_2$ results in dimensions $b_1$ and dimension $b_2$ being different. Dimension $b_1$ and $b_2$ comprise similar dimensions as described for dimension b herein.

Likewise, the conductive features 112b may comprise different widths in the various via 128 layers in the interconnect structure 120, also illustrated in FIG. 5. For example, dimension $w_1$ comprises a width of an uppermost conductive feature 112b, and dimension $w_2$ comprises a width of a lowermost conductive feature 112b in FIG. 5. Dimension $w_1$ and $w_2$ comprise similar dimensions as described for dimension w herein. Dimension $w_1$ is different, e.g., less than, dimension $w_2$ in the example shown.

In embodiments of the present disclosure wherein a plurality of conductive features 112b of the protection pattern 111 is disposed in a plurality of via 130 layers of the interconnect structure 120, two of the plurality of conductive features 112b disposed in two different ones of the plurality of via 130 layers may be substantially aligned, as shown in FIG. 3. The uppermost conductive features 112b are aligned with the lowermost conductive features 112b, for example. Alternatively, in other embodiments, two of the plurality of conductive features 112b disposed in two different ones of the plurality of via 130 layers may not be aligned, as shown in FIG. 5. For example, the uppermost conductive features 112b are not aligned with the lowermost conductive features 112b in FIG. 5.

The various widths and non-alignment of the conductive features 112a and 112b results in dimensions $e_1$ and $e_2$ being different, also illustrated in FIG. 5. Dimension $e_1$ and $e_2$ comprise similar dimensions as described for dimension e herein. FIG. 6 is a top view of the portion of the packaged semiconductor device 100 shown in FIG. 5 in accordance with some embodiments. The various dimensions described herein for the protection pattern 111 in FIG. 5 are illustrated in the top view. Conductive features 112b comprising non-continuous via bar segments formed in the same material layers as vias 130 in a via 130 layer of the interconnect structure 120 in accordance with some embodiments are also illustrated in FIG. 6.

Figure 7:
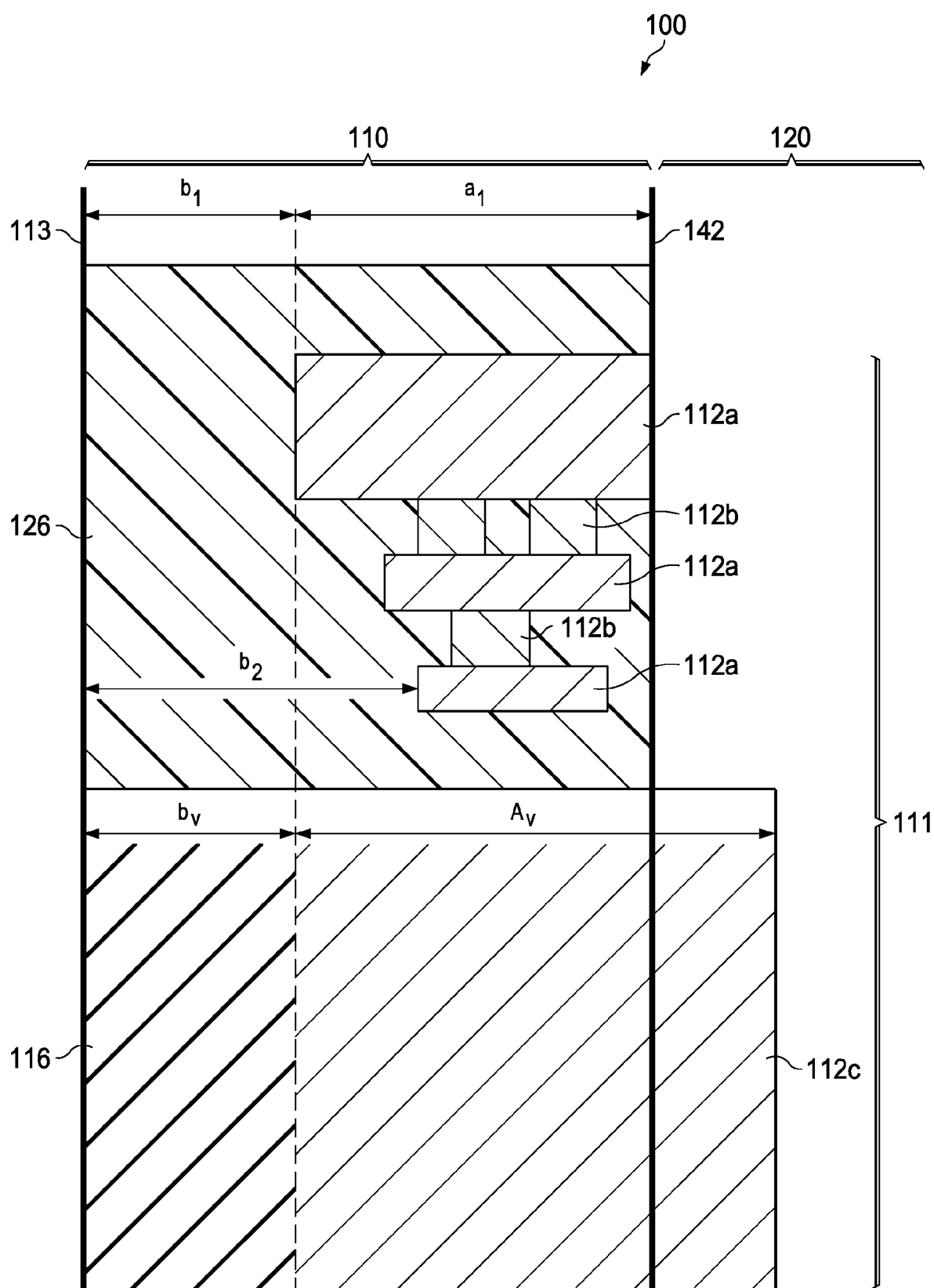
FIG. 7 is a cross-sectional view of a portion of a packaged semiconductor device in accordance with some embodiments of the present disclosure, wherein a portion of the protection pattern is formed in a through-via layer of the package.
Figure 8:
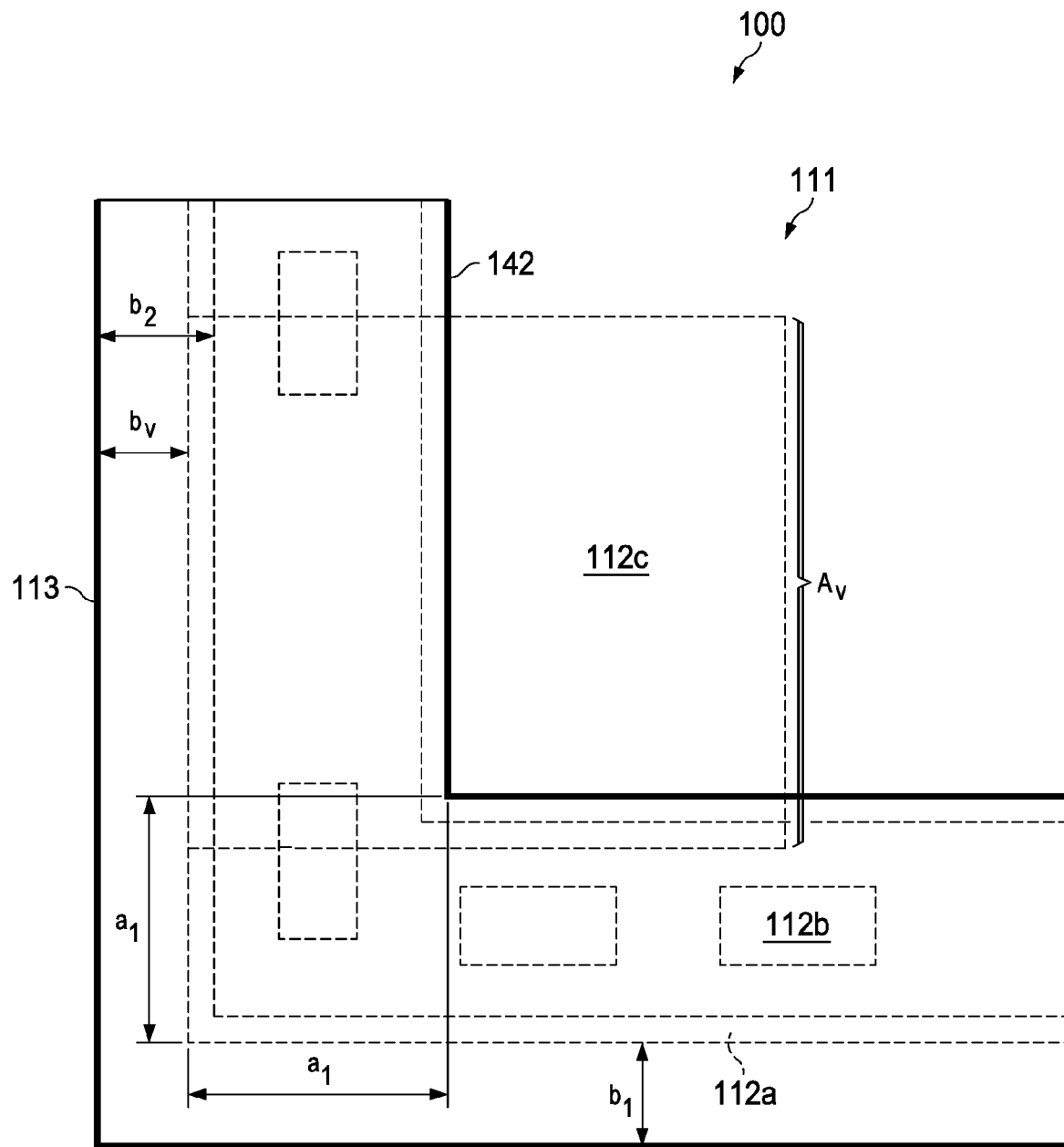
FIG. 8 is a top view of the portion of the packaged semiconductor device shown in FIG. 7 in accordance with some embodiments.

FIG. 7 is a cross-sectional view of a portion of a packaged semiconductor device 100 in accordance with some embodiments of the present disclosure, wherein a portion of the protection pattern 111 is formed in a through-via layer of the package. FIG. 8 is a top view of the portion of the packaged semiconductor device 100 shown in FIG. 7 in accordance with some embodiments. The portion of the protection pattern 111 may comprise substantially the same size as through-vias 106 formed in other regions of the package, below the interconnect structure 120.

For example, a plurality of through-vias 106 (see FIG. 1) may be disposed within the molding material 116, and a portion of the protection pattern 111 may include a conductive feature 112C disposed within the molding material 116, as shown in FIGS. 7 and 8. Each of the plurality of through-vias 106 may comprise a first size, and the conductive feature 112C disposed within the molding material 116 may comprise a second size, the second size being substantially the same as the first size.

Only one conductive feature 112C disposed in the molding material 116 is shown in FIG. 7; however, the protection pattern 111 may include a plurality of conductive features 112C disposed in the molding material 116. The conductive feature 112C of the protection pattern 111 comprises a size or width comprising dimension $A_v$, wherein dimension $A_v$ comprises about 100 μm or greater in some embodiments. The conductive feature 112C is spaced apart from the dicing path 113 by an amount comprising dimension $b_v$, wherein dimension by comprises about 5 μm to about 10 μm in some embodiments. Alternatively, dimensions $A_v$ and $b_v$ may comprise other values.

In the embodiments shown in FIGS. 7 and 8, a portion of the conductive feature 112C may extend past the package edge 142 of the packaged semiconductor device into a region disposed beneath the interconnect structure 120. In other embodiments, a portion of the conductive feature 112C may not extend past the package edge 142 of the packaged semiconductor device into a region disposed beneath the interconnect structure 120, not shown.

Figure 9:
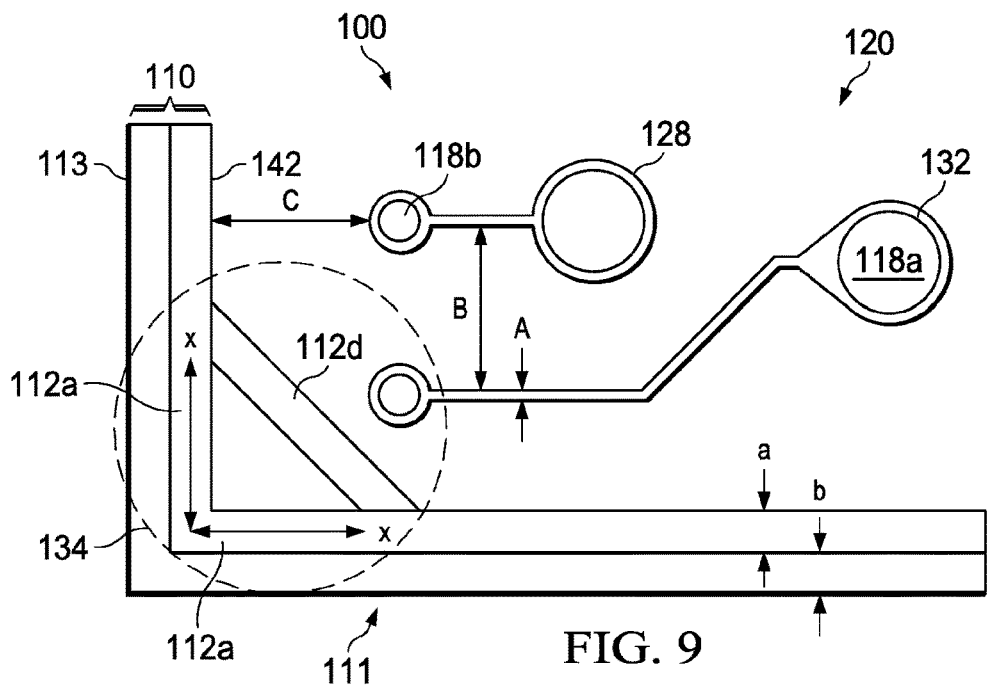
FIG. 9 is a top view of a portion of a packaged semiconductor device, illustrating a portion of a protection pattern formed in a corner region of the package in accordance with some embodiments.

FIG. 9 is a top view of a portion of a packaged semiconductor device 100, illustrating a portion of a protection pattern in formed in a corner region 134 of the package in accordance with some embodiments. The corner regions 134 of the package are reinforced with additional conductive material in empty areas of the interconnect structure 120 (e.g., in regions of the interconnect structure 120 containing no conductive features) in some embodiments. For example, in FIG. 9, conductive features 112a each comprise a first conductive member. The two first conductive members 112a are coupled together in the corner region 134. The two first conductive members 112a are coupled together substantially at a right angle. Thus, the two first conductive members 112a are substantially perpendicular to one another, in some embodiments.

The protection pattern 111 further includes a second conductive member 112d disposed between the two first conductive members 112a in the corner region 134 of the package. The two first conductive members 112a and the second conductive member 112d comprise a substantially triangular shape in the top view.

A length of the two first conductive members 112a comprises a dimension x in some embodiments. Dimension x comprises [2*(a minimal value of dimension C)] in some embodiments. Dimension x comprises about 40 µm in some embodiments, for example. Dimension x comprises about 40 µm in embodiments wherein a minimal value of dimension C comprises about 20 µm, for example. Alternatively, dimension x may comprise other values.

A portion of the conductive features of the protection pattern 111 (e.g., second conductive member 112d) extends past a package edge 142 of the package into a region disposed beneath or proximate the interconnect structure 120 in some of the embodiments shown in FIG. 9 through 13, for example.

FIGS. 10, 11, 12, and 13 are top views of a corner region 134 of a packaged semiconductor device 100 that illustrate some exemplary shapes and arrangements of protection patterns 111 in accordance with some embodiments. A plurality of third conductive members 112e, 112f, and/or 112g are coupled between the second conductive feature 112d and one of the two first conductive members 112a or 112a', or between both the second conductive member 112d and the two first conductive members 112a and 112a'.

Figure 10:
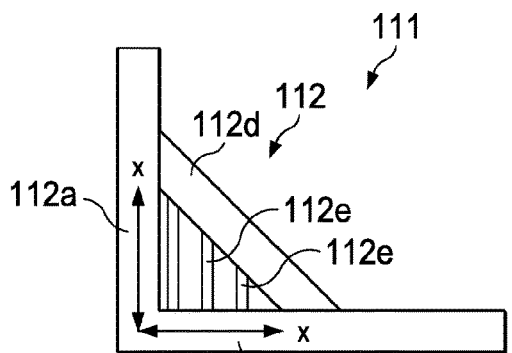
FIGS. 10, 11, 12, and 13 are top views of a corner region of a packaged semiconductor device that illustrate some exemplary shapes and arrangements of protection patterns in accordance with some embodiments.

For example, in the embodiments shown in FIG. 10, the protection pattern 111 in the corner region 132 includes a plurality of third conductive members 112e that are coupled between the second conductive member 112d and first conductive member 112a'. The third conductive members 112e are oriented in a vertical direction in the view shown. In the embodiments shown in FIG. 11, a plurality of third conductive members 112f are coupled between the second conductive member 112d and first conductive member 112a. The third conductive members 112f are oriented in a horizontal direction.

Figure 11:
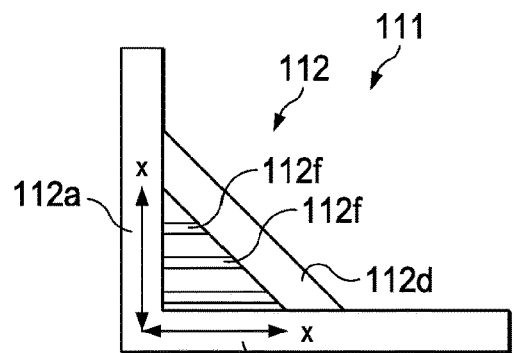
Figure 12:
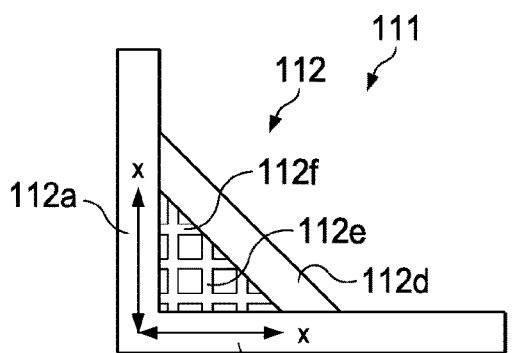

In the embodiments shown in FIG. 12, the structures shown in FIGS. 10 and 11 are combined. The protection pattern 111 in the corner region 134 includes a plurality of third conductive members 112e oriented in a vertical direction that are coupled between the second conductive member 112d and first conductive member 112a', and a plurality of third conductive members 112f oriented in a horizontal direction that are coupled between the second conductive member 112d and first conductive member 112a. The third conductive members 112e and 112f form a grid shaped arrangement of conductive features disposed between the second conductive member 112d and the first conductive members 112a and 112a'.

Figure 13:
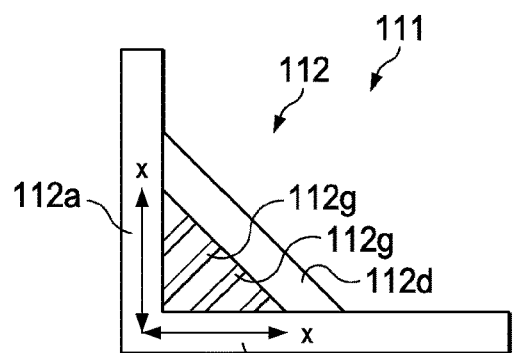

In FIG. 13, the protection pattern 111 in the corner region 134 comprises a plurality of third conductive members 112g that are coupled between the second conductive member 112d and both of the first conductive members 112a and 112a'. The third conductive members 112g extend in parallel from the second conductive member 112d at an angle towards both of the first conductive members 112a and 112a'.

The structures shown in corner regions 134 of the packages shown in FIGS. 9 through 13 are merely examples. The arrangement of the fortified and reinforced protection patterns 111 in corner regions 134 of the packaged semiconductor device 100 may alternatively comprise other shapes, configurations, and arrangements. Additional conductive members comprising different shapes and patterns may also be used.

Figure 14:
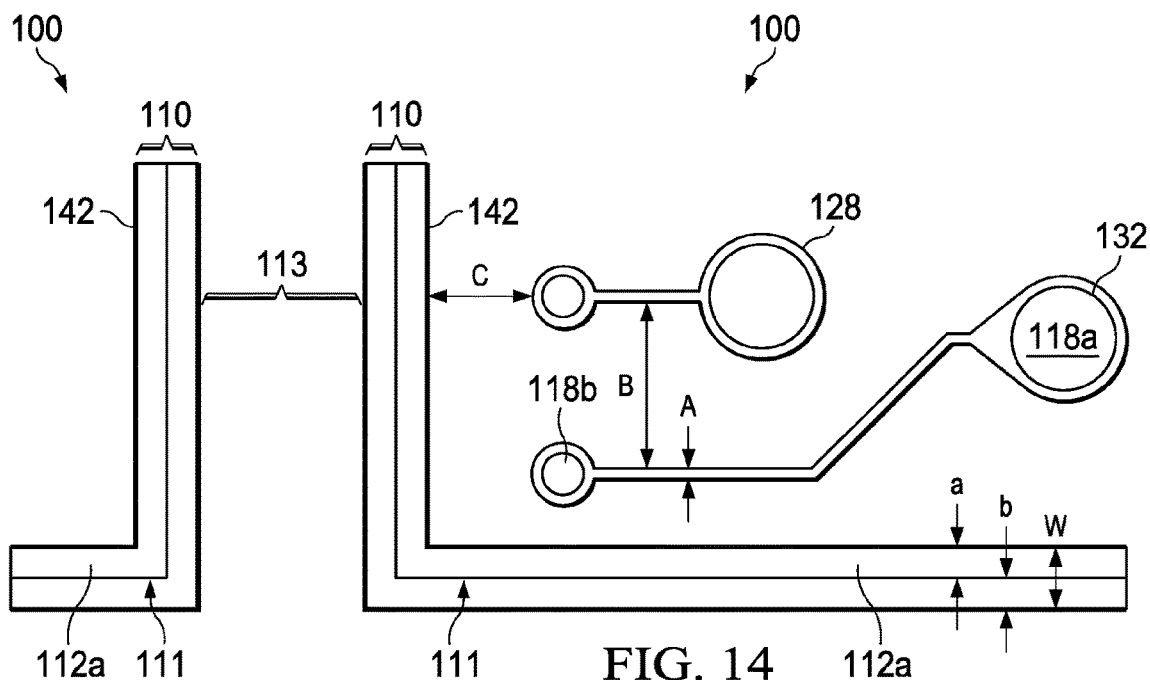
FIG. 14 is a top view illustrating a dicing path disposed between two adjacent packaged semiconductor devices that include protection patterns in accordance with some embodiments.

FIG. 14 is a top view illustrating a dicing path 113 that is disposed between two adjacent packaged semiconductor devices 100 that include protection patterns 111 in perimeter regions no in accordance with some embodiments. The novel protection patterns 111 provide a control structure for the dicing path 113, limiting dicing between the protection patterns 111 and also providing alignment for the dicing process and other processes of the packaged semiconductor devices 100.

FIG. 15 is a cross-sectional view of a packaged semiconductor device 170 in accordance with some embodiments, wherein a packaged semiconductor device 100 described herein is coupled to another packaged semiconductor device 150. The packaged semiconductor device 100 comprises a first packaged semiconductor device 100 in some embodiments, and the first packaged semiconductor device 100 is coupled to a second packaged semiconductor device 150 by a plurality of connectors 158. The connectors 158 which may comprise solder balls or other materials are coupled between contact pads of the first packaged semiconductor device 100 and contact pads of the second packaged semiconductor device 150, for example. Some contact pads are coupled to the integrated circuit die 102 and some of the contact pads are coupled to the through-vias 106, in some embodiments. In some embodiments, the packaged semiconductor device 170 comprises a package-on-package (PoP) device, for example.

The interconnect structure 120 comprises a first interconnect structure 120a in some embodiments. A second interconnect structure 120b is formed on an opposite side of the package than the side the first interconnect structure 120a is formed on, in some embodiments. The first interconnect structure 120a comprises a front side RDL, and the second interconnect structure 120b comprises a back side RDL, in some embodiments.

The packaged semiconductor device 100 includes a plurality of the through-vias 106 formed within the material 116. The through-vias 106 provide vertical connections for the packaged semiconductor device 100. The interconnect structures 120a and 120b provide horizontal electrical connections for the packaged semiconductor device 100. Packaged semiconductor device 150 also includes an interconnect structure 120C that provides horizontal electrical connections for the packaged semiconductor device 150. Interconnect structure 120C is coupled to interconnect structure 120b by a plurality of the connectors 158.

The second packaged semiconductor device 150 includes one or more integrated circuit dies 156 coupled to a substrate 154. In some embodiments, the dies 156 comprise memory chips. For example, the dies 156 may comprise dynamic random access memory (DRAM) devices in some embodiments. Alternatively, the dies 156 may comprise other types of chips. Wire bonds 152 may be coupled to contact pads on a top surface of the integrated circuit die or dies 156, which are coupled to bond pads on the substrate 154. The wire bonds 152 provide vertical electrical connections for the packaged semiconductor device 150 in some embodiments, for example. A molding material 148 may be disposed over the wire bonds 152, the integrated circuit die or dies 156, and the substrate 154.

Alternatively, a PoP device 170 may include two packaged semiconductor devices 100 described herein that are coupled together in some embodiments, not shown in the drawings. In some embodiments, the PoP device 170 may comprise a system-on-a-chip (SOC) device, as another example.

In some embodiments, an insulating material 160 is disposed between the packaged semiconductor devices 100 and 150 between the connectors 158, as shown in phantom (e.g., in dashed lines) in FIG. 15. The insulating material 160 may comprise an underfill material or a molding material, as examples. Alternatively, the insulating material 160 may comprise other materials, or the insulating material 160 may not be included.

Figure 16:
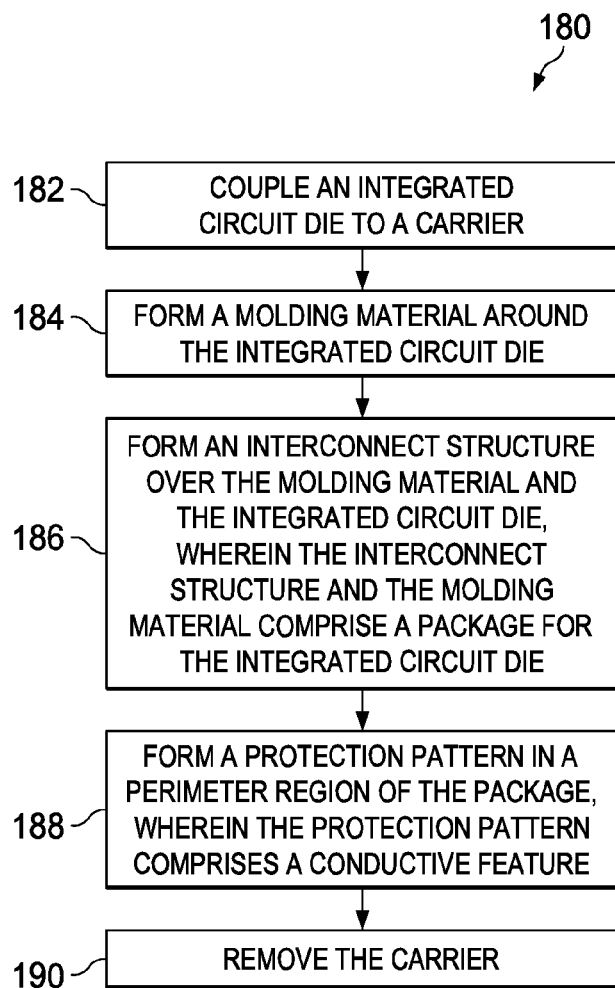
FIG. 16 is a flow chart of a method of packaging a semiconductor device in accordance with some embodiments.

FIG. 16 is a flow chart 180 that illustrates of a method of packaging a semiconductor device in accordance with some embodiments. The method shown in FIG. 16 is an example; however, other methods may also be used that include the novel protection patterns 111 described herein. The flow chart 180 will next be described. FIG. 1 can also be referred to view the elements of the packaged semiconductor device 100.

First, a carrier 101 shown in phantom in FIG. 1 is provided. The carrier 101 may comprises a first carrier in some embodiments. The carrier 101 may comprise glass, silicon oxide, aluminum oxide, or a semiconductor wafer, as examples. The carrier 101 may also comprise other materials.

An integrated circuit die 102 is also provided. The integrated circuit die 102 may be previously fabricated on a semiconductor wafer and singulated along scribe lines to form individual integrated circuit dies 102, for example. The integrated circuit die 102 may comprise a logic chip, a memory chip, a processor, an application specific device, or a chip having other functions, as examples. Only one integrated circuit die 102 is shown in the drawings; however, a plurality of integrated circuit dies 102 may be packaged over the carrier 101 simultaneously, and the packaged devices are later singulated to form individually packaged dies 102 or a plurality of dies 102 packaged together in a single package.

In step 182 of the flow chart 180 shown in FIG. 16, the integrated circuit die 102 is coupled to the carrier 101 manually or using an automated machine such as a pick-and-place machine. The integrated circuit die 102 is coupled to the carrier 101 in the integrated circuit die mounting region 104 as shown in FIG. 1 using an adhesive or a die attach film (DAF), not shown. In some embodiments, one integrated circuit die 102 is coupled to the carrier 101 and is packaged using the techniques described herein. In other embodiments, two or more integrated circuit dies 102 may be coupled to the carrier 101 and packaged together in a single packaged semiconductor device 100 (not shown in the drawings). A plurality of integrated circuit dies 102 comprising the same or different functions may be packaged together in accordance with some embodiments, for example. One or more types of integrated circuit dies 102 may be packaged in a single packaged semiconductor device 100 to form a system on a chip (SoC) device in some embodiments, for example.

In step 184, a molding material 116 is formed over the carrier 101 over the integrated circuit die 102. As applied, the molding material 116 may extend over a top surface of the die 102. The molding material 116 is formed around the integrated circuit die 102. The molding material 116 may be molded using compressive molding, transfer molding, or other methods. The molding material 116 encapsulates the integrated circuit dies 102, for example. The molding material 116 may comprise an epoxy, an organic polymer, or a polymer with or without a silica-based or glass filler added, as examples. In some embodiments, the molding material 116 comprises a liquid molding compound (LMC) that is a gel type liquid when applied. Alternatively, the material molding 116 may comprise other insulating and/or encapsulating materials, or other materials.

In some embodiments, the material molding 116 is applied so that it extends to top surfaces of the integrated circuit dies 102. The top surface of the material 116 is substantially coplanar with top surfaces of the integrated circuit dies 102 in some embodiments, for example. If the molding material 116 extends over top surfaces of the integrated circuit dies 102 after the material 116 is applied, the molding material 116 is removed from over the top surfaces of the integrated circuit dies 102 using a chemical-mechanical polish (CMP) process, an etch process, other methods, or combinations thereof, in some embodiments. The molding material 116 is left remaining around the integrated circuit dies 102.

Next, the molding material 116 is cured using a curing process in some embodiments. The curing process may comprise heating the molding material 116 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 116 may be cured using other methods. In some embodiments, a curing process is not required for the molding material 116.

In step 186, an interconnect structure 120 is formed over the integrated circuit die 102 and the material 116. The interconnect structure 120 is formed over a first side of the integrated circuit die 102 and the material 116 in some embodiments. The first side comprises a front side of the packaged semiconductor device 100 in some embodiments, for example. The interconnect structure 120a comprises one or more insulating material layers 126 and conductive features 128 and 130 formed in the insulating material layers 126. The interconnect structure 120 may be formed using one or more subtractive etch processes or damascene processes, for example. The interconnect structure 120 comprises a first interconnect structure 120a in some embodiments (see FIG. 15).

The interconnect structure 120 and the molding material 116 comprise a package for the integrated circuit die 102 in some embodiments, as described in step 186.

In step 188, a protection pattern 111 is formed in a perimeter region no of the package, as shown in FIG. 1. The protection pattern 111 comprises a conductive feature 112. Step 188 is performed simultaneously with step 186 in some embodiments. The interconnect structure 120 and the protection pattern 111 are simultaneously formed in some embodiments, for example. The protection patterns 111 are formed in the perimeter region no during the fabrication of the interconnect structure 120, for example. The protection patterns 111 are formed in material layers of the interconnect structures 120, as described previously herein.

In some embodiments, after the interconnect structure 120 is formed, the carrier 101 is removed (step 190), and the packaging process for the packaged semiconductor device 100 is complete. A plurality of the packaged semiconductor devices 100 are then singulated using a saw blade or laser along the dicing paths 113. The protection patterns 111 protect the packaged semiconductor devices 100 during the dicing process and prevent or reduce chipping of material layers of the interconnect structure 120, advantageously.

In other embodiments, a plurality of connectors 122 is formed on the interconnect structure 120, also shown in FIG. 1 in phantom. The connectors 122 are formed on UBM structures 132 of the interconnect structure 120, for example. The connectors 122 comprise a eutectic material such as solder, and may comprise solder balls or solder paste in some embodiments. The connectors 122 may include other types of electrical connectors, such as microbumps, controlled collapse chip connection (C4) bumps, or pillars, and may include conductive materials such as Cu, Sn, Ag, Pb, or the like.

In some embodiments, after the connectors 122 are formed, the carrier 101 is removed, and the packaging process for the packaged semiconductor device 100 is complete. A plurality of the packaged semiconductor devices 100 are then singulated using a saw blade or laser along the dicing paths 113.

In other embodiments, a second carrier (not shown) is coupled to the connectors 122 and to the interconnect structure 120, after forming the connectors 122. The second carrier may be coupled to the connectors 122 and/or to the interconnect structure 120 using a temporary adhesive, for example. The first carrier 101 is then removed.

In some embodiments, a second interconnect structure 120b (see FIG. 15) is then formed on a second side of the integrated circuit die 102 and the molding material 116, the second side being opposite the first side. The second side comprises a back side of the packaged semiconductor device 100 in some embodiments, for example. The second interconnect structure 120b comprises similar materials and features as described for the first interconnect structure 120a, for example.

A plurality of connectors 158 is coupled to the second side of the packaged semiconductor device 100 in some embodiments (see FIG. 15). The connectors 158 are coupled to portions of the second interconnect structure 120b in some embodiments, such as contact pads (not shown), for example. The connectors 158 comprise similar materials and formation methods as described for connectors 122 in some embodiments, for example. The second carrier 101b and adhesive are then removed or debonded from a plurality of the packaged semiconductor devices 100, and the packaged semiconductor devices 100 are then singulated using a saw blade or laser along the dicing paths 113.

The packaged semiconductor devices 100 can then be electrically and mechanically coupled to another packaged semiconductor device, to a printed circuit board (PCB), or in an end application or to another object using the connectors 122 and/or 158.

In some embodiments, a method of packaging a semiconductor device includes forming an interconnect structure 120 wherein the interconnect structure 120 comprises a redistribution layer (RDL) or a post-passivation interconnect (PPI) structure.

In some embodiments, a method of packaging a semiconductor device includes forming a plurality of integrated circuit 102 dies to a carrier 101, and forming the molding material 116 around each of the plurality of integrated circuit dies 102. An interconnect structure 120 is formed over each of the plurality of integrated circuit dies 102. A protection pattern 111 is formed in a perimeter region 110 of each of the plurality of integrated circuit dies 102. The plurality of packaged integrated circuit dies 102 are separated along a dicing path 113 proximate the protection patterns 111.

In other embodiments, a method of packaging a semiconductor device further includes aligning the package using the protection pattern 111.

Some embodiments of the present disclosure include packages for semiconductor devices, and methods of packaging semiconductor devices. Other embodiments include packaged semiconductor devices 100 that have been packaged using the novel methods described herein.

Some advantages of embodiments of the present disclosure include providing novel packaging structures and methods wherein protection patterns are included in perimeter regions of packaged semiconductor devices to provide protection for interconnect structure material layers during a dicing process along a dicing path. No additional packaging process steps, lithography masks, lithography processes, or costs are required to include the protection patterns in semiconductor device packages. The protection patterns comprise metal patterns that are added at outer edge of the packages.

The protection patterns prevent or reduce cracking and chipping of conductive material layers and insulating material layers of the interconnect structures, and thus improve yields, provide a cost savings, and result in improved quality. The protection patterns also function as guides during the dicing process, providing improved control. The protection patterns further function as alignment patterns during the dicing process and other processing steps of the packaging process flow, such as alignment marks for a subsequent pick-and-place process used to place the packaged semiconductor devices 100 onto a carrier, as an example. Furthermore, the protection patterns and novel packaging methods and structures described herein are easily implementable in manufacturing and packaging process flows.

In some embodiments, a package for a semiconductor device includes an integrated circuit die mounting region, a molding material disposed around the integrated circuit die mounting region, and an interconnect structure disposed over the molding material and the integrated circuit die mounting region. A protection pattern is disposed in a perimeter region of the package. The protection pattern comprises a conductive feature.

In some embodiments, a packaged semiconductor device includes a molding material, an integrated circuit die disposed within the molding material, and an interconnect structure disposed over the molding material and the integrated circuit die. The molding material and the interconnect structure comprise a package for the integrated circuit die. A protection pattern is disposed in a perimeter region of the package. The protection pattern comprises a plurality of conductive features. The protection pattern is disposed between a package edge and a dicing path of the package.

In other embodiments, a method of packaging a semiconductor device includes coupling an integrated circuit die to a carrier, forming a molding material around the integrated circuit die, and forming an interconnect structure over the molding material and the integrated circuit die. The interconnect structure and the molding material comprise a package for the integrated circuit die. The method includes forming a protection pattern in a perimeter region of the package, wherein the protection pattern comprises a conductive feature. The carrier is removed.

A representative method embodiment includes steps of: coupling an integrated circuit die to a carrier; forming a molding material around the integrated circuit die; forming an interconnect structure over the molding material and the integrated circuit die, wherein the interconnect structure and the molding material comprise a package for the integrated circuit die; forming a protection pattern in a perimeter region of the package that is electrically isolated from the interconnect structure, wherein the protection pattern comprises a conductive feature; and removing the carrier. Forming the interconnect structure may comprise forming a redistribution layer (RDL) or a post-passivation interconnect (PPI) structure. The interconnect structure and the protection pattern may be formed substantially simultaneously. The method may further comprise coupling a plurality of integrated circuit dies to the carrier, wherein forming the molding material comprises forming the molding material around each of the plurality of integrated circuit dies, wherein forming the interconnect structure comprises forming the interconnect structure over each of the plurality of integrated circuit dies, wherein forming the protection pattern comprises forming a protection pattern in a perimeter region of each of the plurality of integrated circuit dies, and wherein the method further comprises separating packaged integrated circuit dies along a dicing path proximate the protection patterns. The method may further comprise aligning the package using the protection pattern.

Another representative embodiment includes steps of: depositing a molding material; disposing an integrated circuit die within the molding material; forming an interconnect structure in the molding material, the interconnect structure disposed within a perimeter region of a package for the integrated circuit die, wherein the molding material and the interconnect structure comprise the package for the integrated circuit die, and the interconnect structure is electrically connected to the integrated circuit die directly or indirectly or is operable to provide electrical connections between the package and components connected to the package; and forming a protection pattern partially disposed in the perimeter region of the package, the protection pattern separate from the interconnect structure, wherein the protection pattern comprises a plurality of conductive features that are not electrically connected to the integrated circuit die either directly or indirectly, and the protection pattern does not extend beyond surfaces of the package. The plurality of conductive features may extend along the perimeter region of a plurality of sides of the package. Forming the protection pattern may further comprise the plurality of conductive features disposed in a plurality of conductive line layers of the interconnect structure, wherein two of the plurality of conductive features disposed in two different ones of the plurality of conductive line layers comprise substantially a same width. Forming the protection pattern may further comprise the plurality of conductive features disposed in a plurality of conductive line layers of the interconnect structure, wherein two of the plurality of conductive features disposed in two different ones of the plurality of conductive line layers comprise different widths. Forming the protection pattern may further comprise the plurality of conductive features disposed in a plurality of via layers of the interconnect structure, wherein two of the plurality of conductive features disposed in two different ones of the plurality of via layers are substantially aligned. Forming the protection pattern may further comprise the plurality of conductive features disposed in a plurality of via layers of the interconnect structure, wherein two of the plurality of conductive features disposed in two different ones of the plurality of via layers are not aligned. Forming the protection pattern may further comprise the plurality of conductive features having a plurality of first conductive members, wherein two of the plurality of first conductive members are coupled together in a corner region of the package, the protection pattern comprising a second conductive member disposed between the two of the plurality of first conductive members in the corner region of the package, and the two of the plurality of first conductive members and the second conductive member comprising a substantially triangular shape. The two of the plurality of first conductive members may be substantially perpendicular to one another. The protection pattern may have a plurality of third conductive members disposed between the second conductive member and one of the two of the plurality of first conductive members or between the second conductive member and the two of the plurality of first conductive members.

Yet another representative embodiment includes steps of: disposing a molding material disposed around a mounting region of an integrated circuit die mounting region; depositing an insulating layer over the integrated circuit die mounting region and the molding material, the insulating layer having a bottom surface and a top surface, the bottom surface adjacent to the integrated circuit die mounting region and the molding material; forming an interconnect structure in the insulating layer, the interconnect structure configured to provide electrical connections extending between the top surface of the insulating layer and the bottom surface of the insulating layer; and forming a protection pattern in a perimeter region of the molding material, the perimeter region being adjacent to the interconnect structure, wherein the protection pattern comprises conductive features separate from the interconnect structure, the conductive features electrically isolated from the interconnect structure, and a topmost surface of the conductive features below a top surface of the insulating layer. Forming the protection pattern may further comprise disposing the protection pattern within the insulating layer that a portion of the interconnect structure is formed in. The protection pattern may have a plurality of conductive features. Forming the protection pattern may further comprise disposing a plurality of through-vias within the molding material, each of the plurality of through-vias comprising a first size, wherein a portion of the protection pattern includes a conductive feature disposed within the molding material, and wherein the conductive feature disposed within the molding material comprises a second size, the second size being substantially equal to the first size. A portion of the conductive feature may extend past a package edge into a region disposed beneath or proximate the interconnect structure. Forming the protection pattern may further comprise disposing the protection pattern between a package edge and a dicing path, wherein the interconnect structure is positioned internal to the package edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a protection pattern located over an encapsulant;
a dielectric material isolating the protection pattern and being at least partially located between the encapsulant and a closest point of the protection pattern to the encapsulant, the dielectric material extending from over the encapsulant to over a semiconductor die;
conductive redistribution elements within the dielectric material, the conductive redistribution elements electrically connecting the semiconductor die to a plurality of external connections on a first side of the dielectric material, the plurality of external connections being the only external connections on the first side of the dielectric material, and wherein the protection pattern is electrically isolated from the plurality of external connections;
a printed circuit board in physical connection with the plurality of external connections; and
a packaged semiconductor device located on an opposite side of the encapsulant from the printed circuit board.

2. The semiconductor device of claim 1, further comprising through vias extending from a first side of the encapsulant to a second side of the encapsulant.

3. The semiconductor device of claim 1, wherein the encapsulant is free from through vias.

4. The semiconductor device of claim 1, wherein the conductive redistribution elements are a same size as conductive elements of the protection pattern.

5. The semiconductor device of claim 1, wherein the conductive redistribution elements are a same thickness as conductive elements of the protection pattern.

6. The semiconductor device of claim 1, wherein the conductive redistribution elements are a same width as conductive elements of the protection pattern.

7. A semiconductor device comprising:
a conductive redistribution layer extending over both a first semiconductor device and an encapsulant adjacent to the first semiconductor device;
a protection pattern located over the encapsulant, the protection pattern comprising a second conductive material that is electrically isolated from all elements below a surface of the encapsulant, the surface of the encapsulant facing the protection pattern; and
dielectric material electrically isolating the protection pattern and separating the protection pattern from the encapsulant;
a plurality of external connections electrically connecting the conductive redistribution layer to a printed circuit board; and
a packaged semiconductor device on an opposite side of the conductive redistribution layer from the printed circuit board, the packaged semiconductor device comprising a first semiconductor die wire bonded to a package substrate and a second semiconductor die wire bonded to the package substrate.

8. The semiconductor device of claim 7, wherein the protection pattern extends along at least four sides of the semiconductor device.

9. The semiconductor device of claim 7, wherein the conductive redistribution layer is separated from the protection pattern by at least 20 μm.

10. The semiconductor device of claim 7, wherein the protection pattern is located within a protection region, the protection region having a width of between about 5 μm and about 60 μm.

11. The semiconductor device of claim 7, wherein the protection pattern comprises a first conductive feature overlying a second conductive feature, the first conductive feature being electrically connected to the second conductive feature through vias.

12. The semiconductor device of claim 11, wherein the first conductive feature has a greater dimension than the second conductive feature.

13. The semiconductor device of claim 11, wherein the first conductive feature is not aligned with the second conductive feature.

14. The semiconductor device of claim 7, wherein a portion of the second conductive material extends beneath the conductive redistribution layer.

15. A semiconductor device comprising:
a semiconductor die encapsulated within an encapsulant;
a plurality of first conductive layers overlying both the semiconductor die and the encapsulant;
a plurality of protective layers overlying the encapsulant, wherein individual ones of the plurality of protective layers are aligned with respective ones of the plurality of first conductive layers;
a dielectric material completely electrically isolating the plurality of protective layers from the plurality of first conductive layers, from the encapsulant, and from each external connector located on an opposite side of the dielectric material from the semiconductor die, wherein the dielectric material is free from other external connectors different from the each external connectors on the opposite side of the dielectric material from the semiconductor die; and
a packaged semiconductor device electrically connected to the semiconductor die with second external connectors, wherein the packaged semiconductor device is free from other external connectors different from the second external connectors, wherein each of the second external connectors electrically connect the packaged semiconductor device to the semiconductor die.

16. The semiconductor device of claim 15, further comprising a through via extending from a first side of the encapsulant to a second side of the encapsulant.

17. The semiconductor device of claim 15, wherein the dielectric material has a first dimension between the plurality of first conductive layers and the plurality of protective layers, the first dimension being greater than at least 20 μm.

18. The semiconductor device of claim 15, wherein individual ones of the plurality of protective layers are misaligned with each other.

19. The semiconductor device of claim 15, wherein a first one of the plurality of first conductive layers has a same width as a first one of the plurality of protective layers.

20. The semiconductor device of claim 15, wherein a first one of the plurality of first conductive layers has a same thickness width as a first one of the plurality of protective layers.

* * * * *